(12) United States Patent
Adkisson et al.

(10) Patent No.: US 6,563,131 B1
(45) Date of Patent: May 13, 2003

(54) METHOD AND STRUCTURE OF A DUAL/WRAP-AROUND GATE FIELD EFFECT TRANSISTOR

(75) Inventors: James W. Adkisson, Jericho, VT (US); Paul D. Agnello, Wappingers Falls, NY (US); Arne W. Ballantine, Cold Spring, NY (US); Christopher S. Putnam, Hinesburg, VT (US); Jed H. Rankin, Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/586,501

(22) Filed: Jun. 2, 2000

(51) Int. Cl.[7] .................. H01L 29/06; H01L 29/76; H01L 27/12
(52) U.S. Cl. ............... 257/20; 257/20; 257/24; 257/27; 257/66; 257/353; 257/347
(58) Field of Search ............... 257/20, 24, 27, 257/66, 353, 347

(56) References Cited

U.S. PATENT DOCUMENTS

| | | |
|---|---|---|
| 4,763,183 A | 8/1988 | Ng et al. |
| 4,996,574 A * | 2/1991 | Shirasaki ............... 357/23.7 |
| 5,075,237 A * | 12/1991 | Wu ............... 437/2 |
| 5,315,143 A | 5/1994 | Tsuji |
| 5,349,228 A | 9/1994 | Neudeck et al. |
| 5,446,301 A | 8/1995 | Eguchi et al. |
| 5,466,664 A | 11/1995 | Inada et al. |
| 5,497,019 A | 3/1996 | Mayer et al. |
| 5,508,545 A | 4/1996 | Uchiyama |
| 5,563,082 A | 10/1996 | Mukai |
| 5,616,944 A * | 4/1997 | Mizutani et al. ............ 257/365 |
| 5,619,054 A | 4/1997 | Hashimoto |
| 5,623,155 A | 4/1997 | Kerber et al. |
| 5,646,058 A * | 7/1997 | Taur et al. ............... 437/40 |
| 5,663,078 A | 9/1997 | McCarthy |
| 5,736,437 A | 4/1998 | Dennison et al. |
| 5,759,878 A | 6/1998 | Hayashi et al. |
| 5,793,058 A | 8/1998 | Han et al. |
| 5,801,397 A | 9/1998 | Cunningham |
| 5,920,085 A * | 7/1999 | Han et al. ............... 257/66 |
| 6,060,743 A * | 5/2000 | Sugiyama et al. ........ 257/321 |

FOREIGN PATENT DOCUMENTS

JP     406140636 A   *   5/1994

* cited by examiner

*Primary Examiner*—Eddie Lee
*Assistant Examiner*—Joseph Nguyen
(74) *Attorney, Agent, or Firm*—Mark F. Chadurjian; Andrew M. Calderon

(57) ABSTRACT

Off-current is not compromised in a field effect transistor having a gate length less than 100 nanometers in length by maintaining the conduction channel width one-half to one-quarter of the gate length and locating the gate on at least two sides of the conduction channel and to thus create a full depletion device. Such a narrow conduction channel is achieved by forming a trough at minimum lithographic dimensions, forming sidewalls within the trough and etching the gate structure self-aligned with the sidewalls. The conduction channel is then epitaxially grown from the source structure in the trough such that the source, conduction channel and drain region are a unitary monocrystalline structure.

18 Claims, 12 Drawing Sheets

C-C

B-B

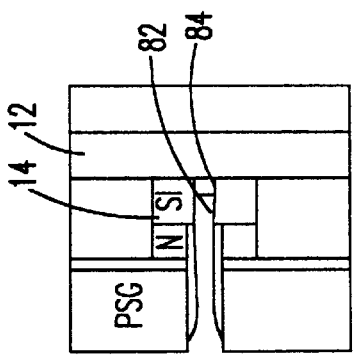
FIG. 8C
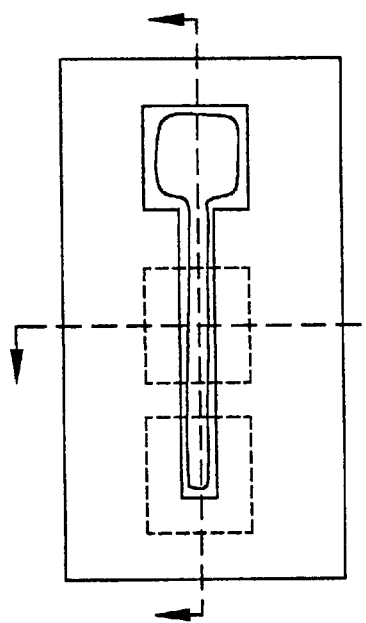
FIG. 8A
FIG. 8B
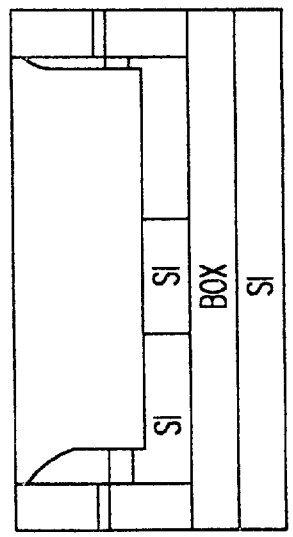

METHOD AND STRUCTURE OF A DUAL/WRAP-AROUND GATE FIELD EFFECT TRANSISTOR

BACKGROUND OF THE INVENTION

1. Field of the Invention

The present invention generally relates to structures and manufacturing methods for integrated circuits including field effect transistors (FETs) and, more particularly to high performance FETs suitable for integrated circuits formed at high integration density.

2. Description of the Prior Art

It has been recognized for some years that increased integration density in integrated circuits provides not only improvements in performance and functionality but manufacturing economy, as well. Reduced device sizes and increased numbers of devices on a single chip of a given size have required designs operable at reduced voltages to accommodate both breakdown voltages of smaller and thinner structures and total chip heat dissipation as higher clock frequencies are employed in greater numbers of devices. Unfortunately, as devices are scaled to smaller sizes and operated at lower voltages, some electrical effects are encountered which are deleterious to device performance.

Specifically, one effect of reducing channel or gate length below 50 nanometers (and reduction of operating voltage) is the finite depth in the FET channel which can be controlled by the gate. If conduction cannot be controlled over the full depth of the conduction channel, so-called off-current is increased, reducing operating margins already limited by reduced voltage operation and increasing noise susceptibility of the circuits integrated on the chip. Power dissipation is also increased since the transistors, in effect, cannot be fully turned off.

It is known to place gates on opposing sides of a channel of an FET (essentially variations on substrate bias of very early FETs) and theoretical and experimental studies have confirmed that substantial improvements in FET performance are possible using gate structures which partially or fully surround the conduction channel. However, these same studies have demonstrated a requirement for an extremely thin diffusion region since, for short gate lengths of interest, the gate length must be maintained about 2–4 times the diffusion thickness.

That is, for gate lengths of 20–100 nanometers, the diffusion thickness forming the channel must be held to 5–50 nanometers. Such a thin diffusion region has not been possible consistent with other process requirements of FETs even where the gate does not partially surround the channel. Therefore, this effect encountered at short gate lengths clearly imposes a trade-off between performance and minimum transistor dimensions and thus presents a severe limitation on device size and integration density.

SUMMARY OF THE INVENTION

It is therefore an object of the present invention to provide a field effect transistor structure with a particularly short gate length while providing good performance, including low off-current.

It is another object of the invention to provide a practical manufacturing method, consistent with high integration density, for FETs having reduced gate length.

In order to accomplish these and other objects of the invention, a field effect transistor and an integrated circuit are provided comprising a conduction channel, and a gate located on at least two sides of said conduction channel and separated from a source region. The separation of the gate from the source reduces gate-source capacitance and allows epitaxial growth of the channel from the transistor source region to also form the transistor drain.

In accordance with another aspect of the invention a method of fabricating an integrated circuit including a field effect transistor having a conduction channel and a gate located on at least two sides of the conduction channel and separated from a source region, is provided comprising steps of patterning a doped silicon layer to form separated gate and source structures, forming a trough in the gate and source structures, forming an oxide film in the trough in the gate structure, and epitaxially growing a conduction channel and a drain region from the source structure through the gate structure.

BRIEF DESCRIPTION OF THE DRAWINGS

The foregoing and other objects, aspects and advantages will be better understood from the following detailed description of a preferred embodiment of the invention with reference to the drawings, in which:

FIGS. 8A, 8B and 8C are plan, side cross-sectional and axial cross-sectional views of the transistor in accordance with the invention at a eighth stage of manufacture.

DETAILED DESCRIPTION OF A PREFERRED EMBODIMENT OF THE INVENTION

Figure 1C:
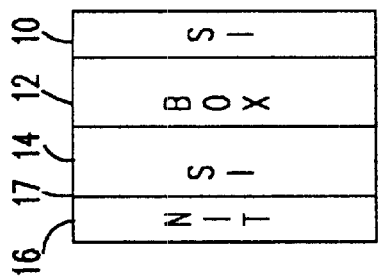
FIGS. 1A, 1B and 1C are plan, side cross-sectional and axial cross-sectional views of the transistor in accordance with the invention at a first stage of manufacture.
Figure 1A:
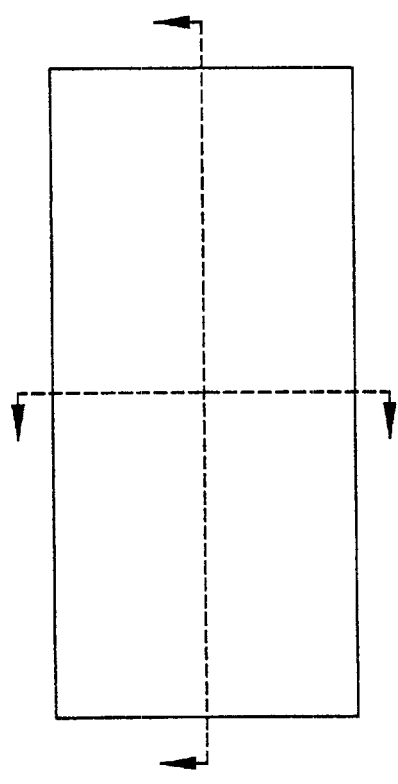
Figure 1B:
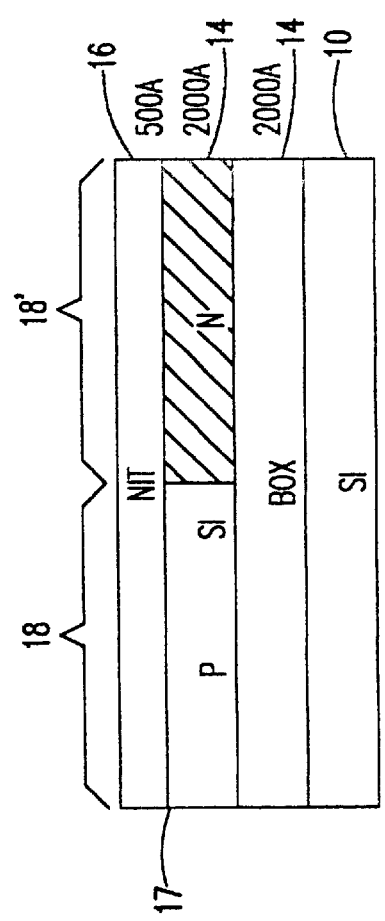
Figure 2A:
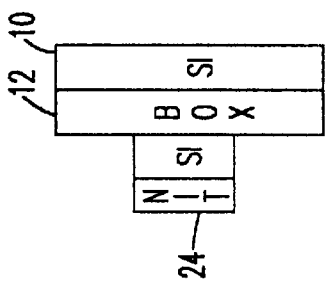
FIGS. 2A, 2B, 2C and 2D are plan, side cross-sectional, axial cross-sectional and perspective views of the transistor in accordance with the invention at a second stage of manufacture.
Figure 2B:
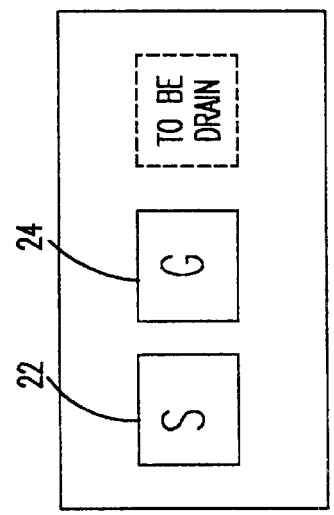
Figure 2C:
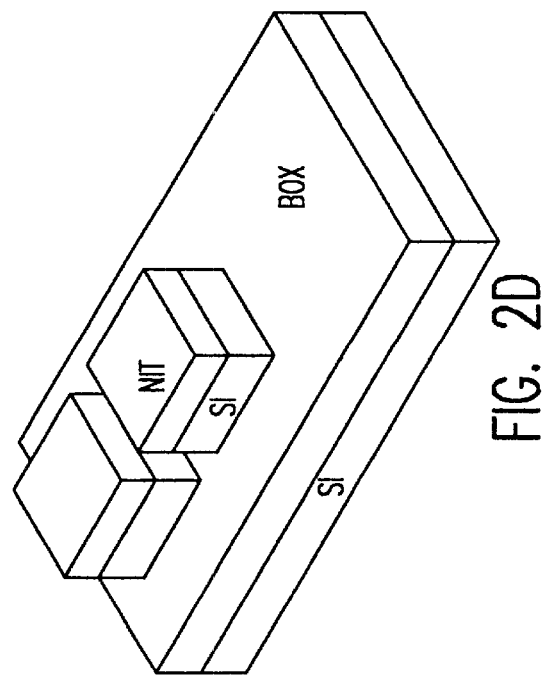
Figure 2D:
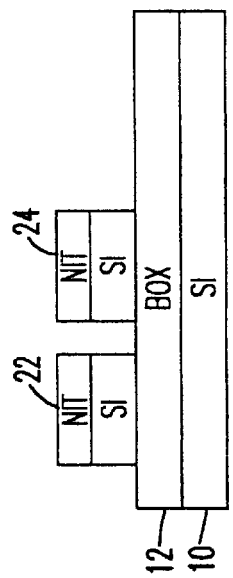

Referring now to the drawings, and more particularly to FIGS. 1A–1C, there is shown a portion of a silicon-on-insulator (SOI) wafer preferred for practice of the invention. It should be understood that the portion of the SOI wafer is not the same as that shown in other Figures but is chosen to illustrate impurity implantation in accordance with block-out masking for formation of impurity wells for formation of complementary (e.g. CMOS) transistors. Otherwise. blanket impurity implantation can be performed when only PMOS or NMOS transistors are to be formed on the wafer or chip.

The preferred SOI wafer includes a bulk silicon layer 10 to structurally support the remaining layers. Structures (e.g. heat removal structures, inter-wafer connectors and the like) are generally not formed in the bulk silicon layer but could be provided in combination with the invention if desired. A buried oxide (BOX) insulator 12 (e.g. silicon dioxide, SiO) of about 2000 Angstroms is provided over the bulk silicon 10 to insulate the active silicon layer 14 therefrom. The active silicon layer may be from about 100 to 10000 Angstroms in thickness (preferably about 2000 Angstroms) nut neither the thickness of the BOX layer 12 nor the thickness of the active silicon layer 14 is critical to the practice of the invention.

The active silicon layer 14 is then doped to gate or well impurity doping levels as may be desired to obtain the desired conductivity thereof. Regions 18, 18' are shown as differing impurity types for production of CMOS transistors in respective ones of these regions. As alluded to above, other Figures will show steps for fabrication of a single transistor in only one of regions 18, 18' but it should be understood that the illustrated steps are equally representative of and applicable to either region. It should similarly be understood that while the formation of only a single transistor will be described and illustrated, the illustration thereof should be understood as representative of formation of similar transistors concurrently in any or all desired regions of the wafer.

After (or before) implantation, a pad nitride layer 16 is deposited on the wafer by any known or suitable technique. The thickness of the pad nitride is preferably about 100 to 500 Angstroms but is not particularly critical to the practice of the invention. A thin thermal oxide 17 (about 60 Angstroms) is preferably grown between the active silicon layer 14 and the nitride 16 to reduce stress.

Referring now to FIGS. 2A–2D, the source and gate regions of the transistor are then inversely patterned through the nitride 16, oxide 17 and silicon active layer 14 using the BOX layer 12 as an etch stop. This leaves the source and gate regions as separated raised pedestals. The separation is not particularly critical to the practice of the invention but is preferably chosen in accordance with a trade-off between desired values of gate capacitance (which will be reduced with increased separation) and channel resistance (which will be increased with increased separation) and, of course, overall transistor dimensions and minimum lithographic feature size and registration capability.

Figure 3A:
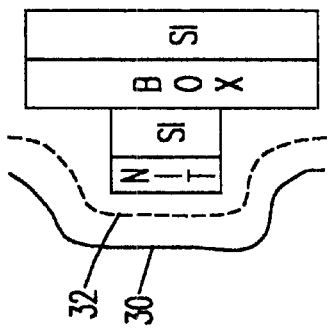
FIGS. 3A, 3B and 3C are plan, side cross-sectional and axial cross-sectional views of the transistor in accordance with the invention at a third stage of manufacture.
Figure 3B:
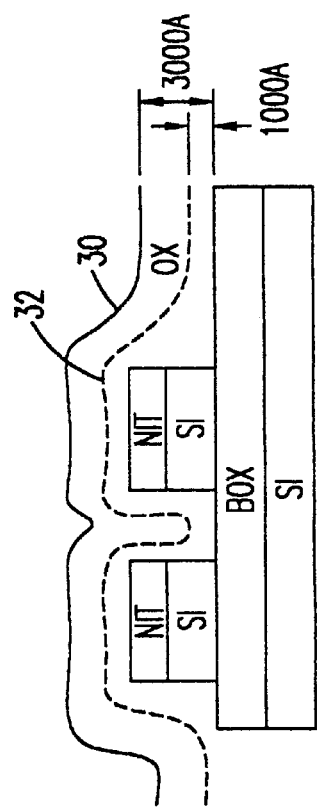
Figure 3C:
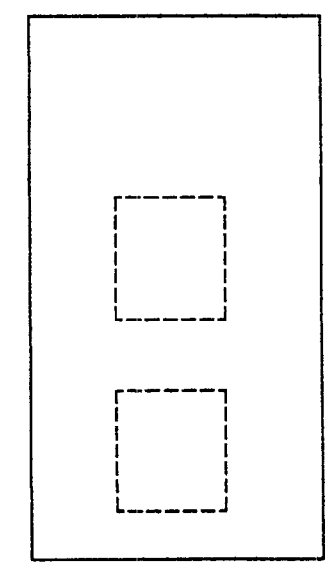
Figure 4A:
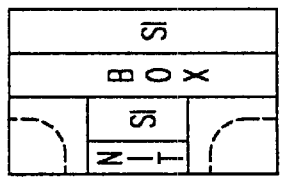
FIGS. 4A, 4B, 4C and 4D are plan, side cross-sectional, axial cross-sectional and perspective views of the transistor in accordance with the invention at a fourth stage of manufacture.
Figure 4B:
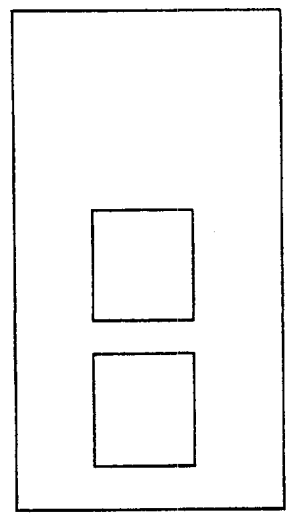
Figure 4C:
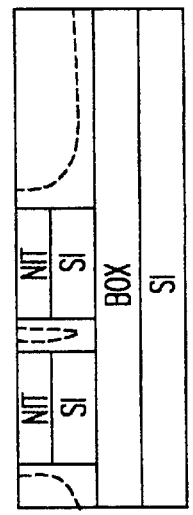
Figure 4D:
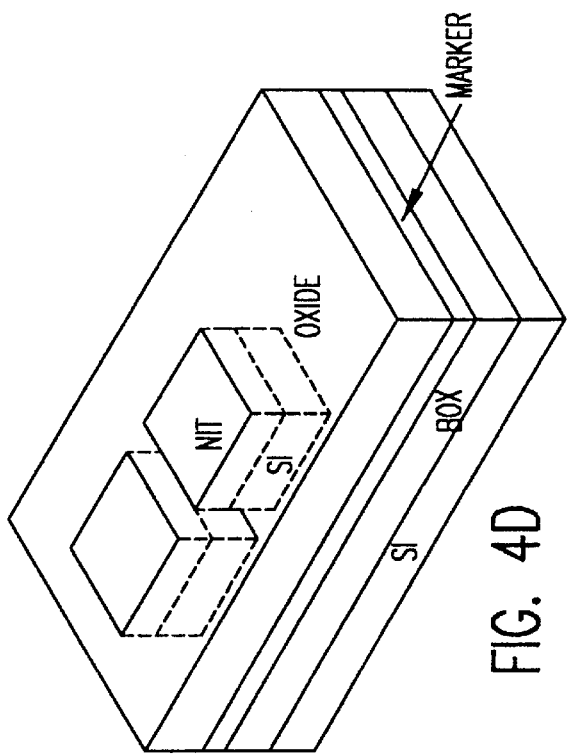

Then, as illustrated in FIGS. 3A–3C a thick layer 30 of oxide is deposited. The thickness of this oxide layer should equal or preferably exceed the thickness of original active silicon layer 14 and the pad nitride and may thus be from 1000 to 15000 Angstroms thick. The thickness of the oxide layer is not otherwise critical to the practice of the invention. It is also preferred to provide a thin (e.g. about 10–50 Angstroms) nitride marker layer 32, preferably grown by rapid thermal nitridization (RTN, in which nitrogen gas is flowed during oxide deposition), at about one-half the thickness of the original silicon active layer 14 (or, more specifically, to define the vertical extent of the transistor channel below the upper surface of the gate 24). The thick oxide layer 30 is then planarized to nitride layer 16, preferably by a chemical/mechanical polish (CMP) using the nitride 16 as a polish stop, as shown in FIGS. 4A–4D.

Figure 5A:
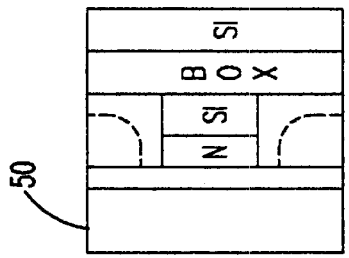
FIGS. 5A, 5B and 5C are plan, side cross-sectional and axial cross-sectional views of the transistor in accordance with the invention at a fifth stage of manufacture.
Figure 5B:
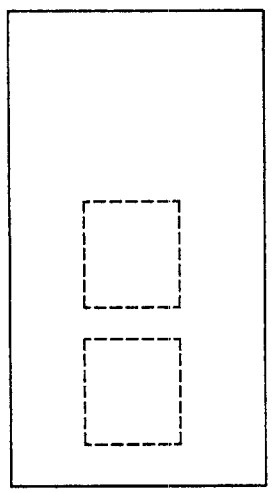
Figure 5C:
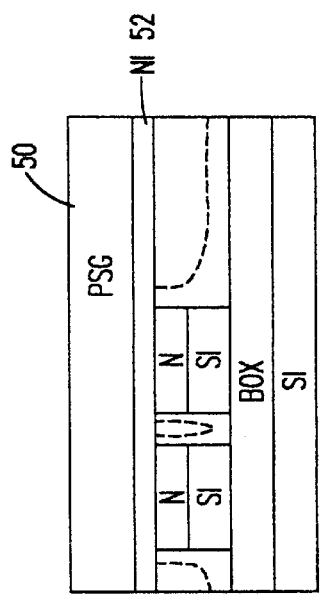
Figure 6C:
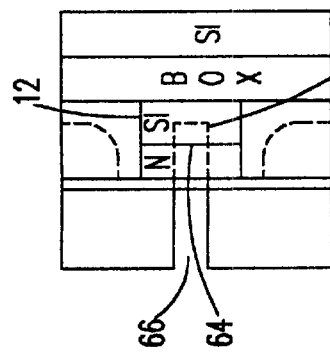
FIGS. 6A, 6B, 6C and 6D are plan, side cross-sectional, axial cross-sectional and perspective views of the transistor in accordance with the invention at a sixth stage of manufacture.
Figure 6D:
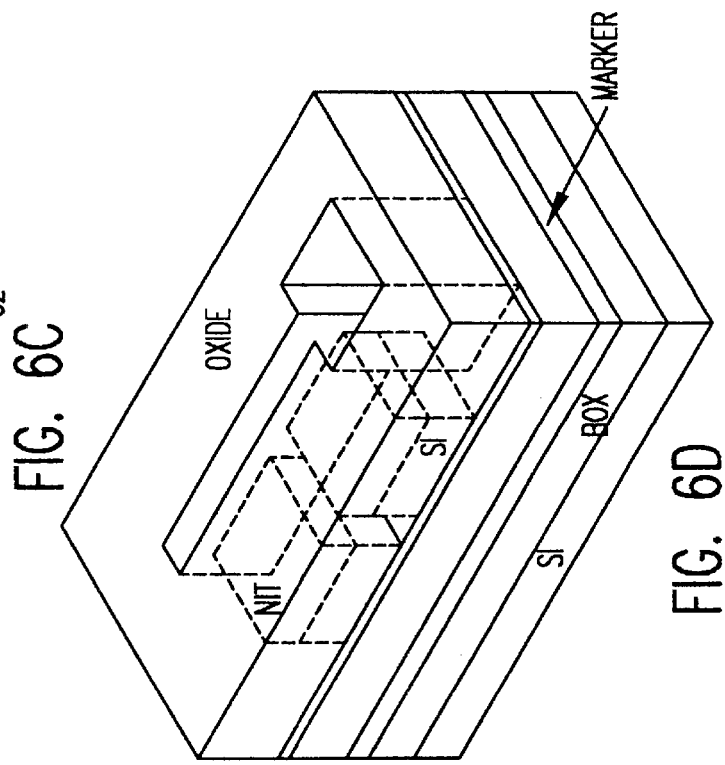
Figure 6A:
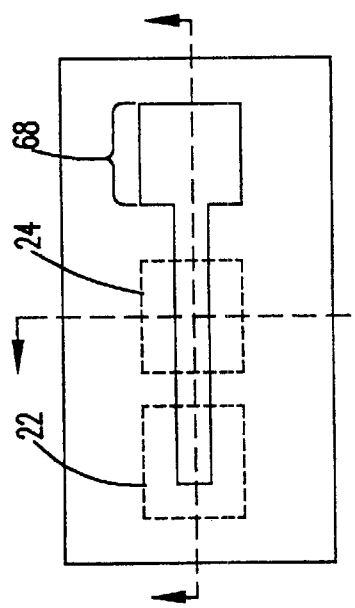
Figure 6B:
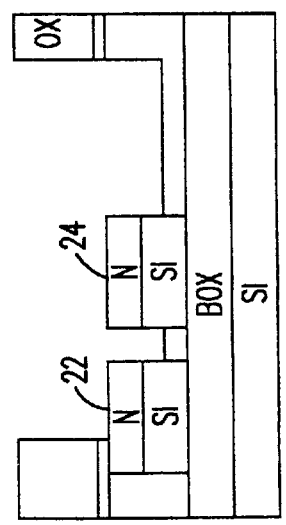

Then, as shown in FIGS. 5A–5C, a thick (e.g. about 2000 Angstroms) mandrel film layer 50 of oxide or phosphosilicate glass is applied over a thin nitride film 52 preparatory to forming the drain and conduction channel of the transistor. (The dashed lines in FIG. 5A show, for reference, the location of pedestals in prior Figures.) A resist is then applied and patterned in a key-like shape crossing above gate 24 and at least a portion of source 22 and the oxide or phosphosilicate glass layer 50 is then similarly patterned, as shown in FIGS. 6A–6D. This patterning can be continued to the silicon layer and surrounding oxide layer 12 as shown by dashed line 62 in FIG. 6C by etching to the nitride marker layer. However, doing so at this stage would produce a feature which has a width at least as large as the minimum lithographic feature size of the design.

Figure 7C:
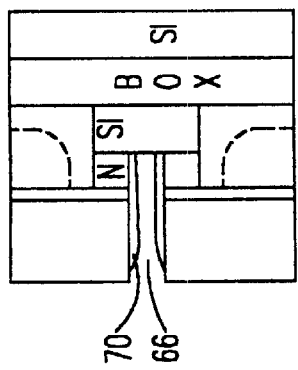
FIGS. 7A, 7B and 7C are plan, side cross-sectional and axial cross-sectional views of the transistor in accordance with the invention at a seventh stage of manufacture.
Figure 7A:
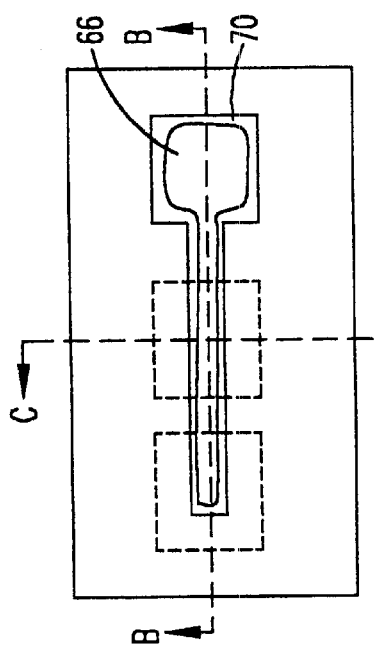
Figure 7B:
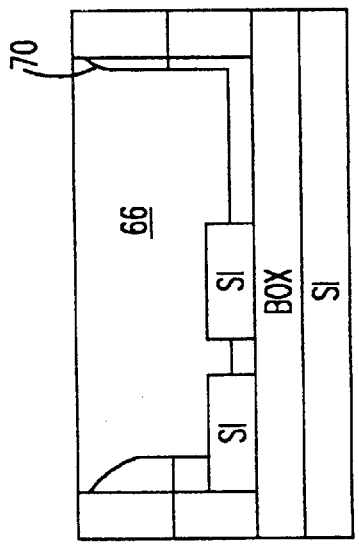

While such dimensions would result in an operative transistor with relatively large current capacity (but possibly high off-current, as well, if the gate is short), it is preferred that the channel region of the transistor be of sub-lithographic dimensions to enhance performance of the transistor. This sub-lithographic dimension is preferably achieved by stopping the etch at the surface 64 of active silicon 14, depositing a nitride layer of a desired thickness to form sidewalls 70 in trench 66 when anisotropically etched, as shown in FIGS. 7A to 7C.

Then, as shown in FIGS. 8A–8C, the silicon 14 of the gate and source regions can be etched to form a trough of sublithographic dimensions (e.g. less than 500 Angstroms wide) in the gate and source. The depth should preferably be limited to a similar dimension as can be readily achieved by stopping the etch in accordance with (e.g. at) the nitride marker 17. It should be noted that while a nitride marker is preferred for this process since silicon can be etched selectively to it and nitride thus provides somewhat increased process margins, any other marker arrangement (e.g. detection of trace gases by optical emission spectrometry when the deposition process is briefly interrupted) can be used. The gate will then wrap around three sides of the conduction channel when epitaxial silicon is grown in the trench 82.

Alternatively, the trench 82 can be etched through silicon 14 to BOX 12, as shown at 84 such that the gate will remain on two sides of the trench/conduction channel. The current-carrying capacity of the transistor can be increased in this manner without significant compromise of the improved off-current performance of the preferred form of the transistor in accordance with the invention. This alternative form of the invention can also be used in combination with increased spacing between the gate and the source 22 and drain 68 regions to reduce gate capacitance without significant compromise of channel conductivity.

Figure 9C:
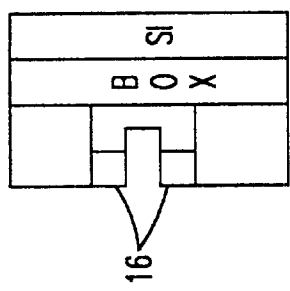
FIGS. 9A, 9B, 9C and 9D are plan, side cross-sectional, axial cross-sectional and perspective views of the transistor in accordance with the invention at a ninth stage of manufacture.
Figure 9D:
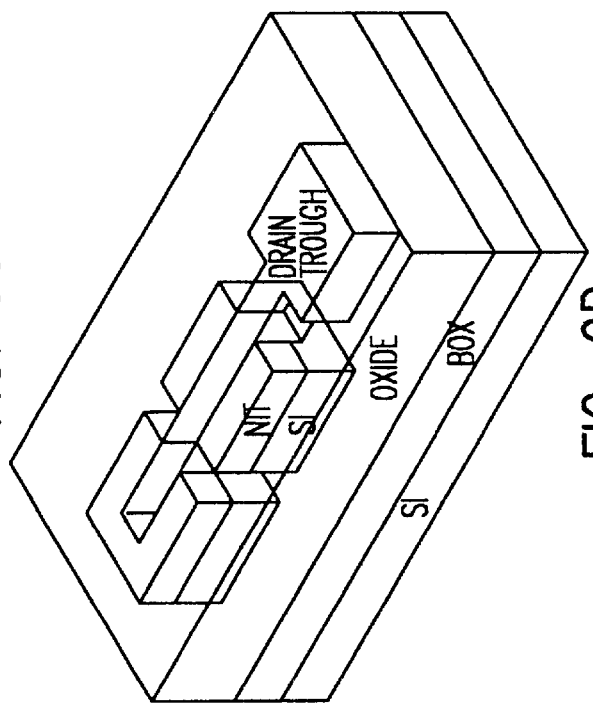
Figure 9A:
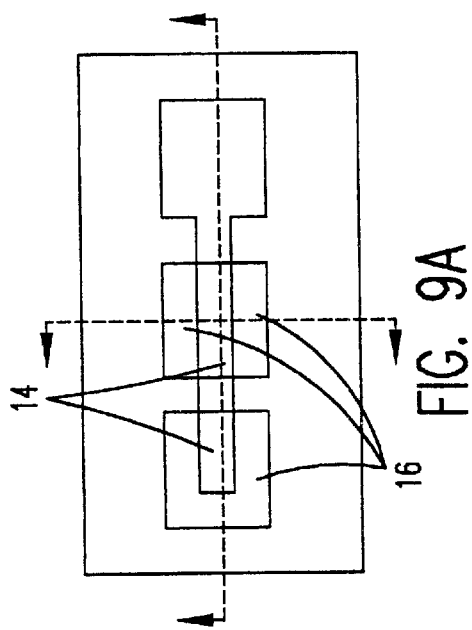
Figure 9B:
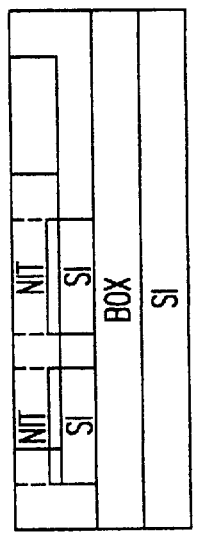
Figure 10C:
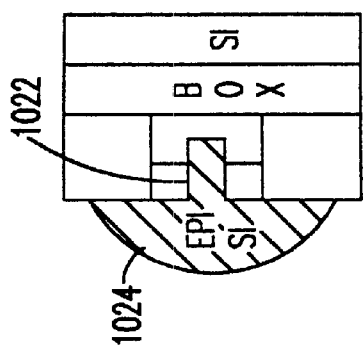
FIGS. 10A, 10B and 10C are plan, side cross-sectional and axial cross-sectional views of the transistor in accordance with the invention at a tenth stage of manufacture.
Figure 10A:
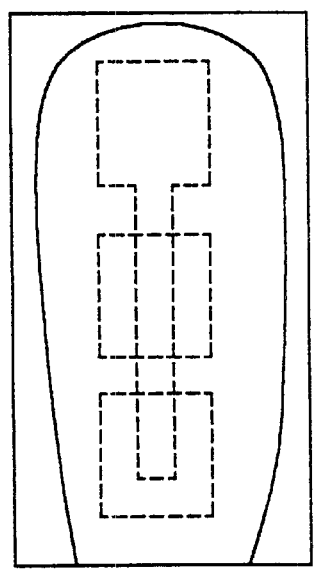
Figure 10B:
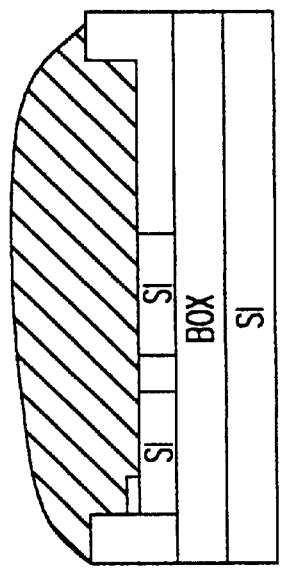
Figure 11C:
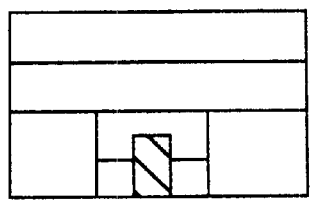
FIGS. 11A, 11B, 11C and 11D are plan, side cross-sectional, axial cross-sectional and perspective views of the transistor in accordance with the invention at an eleventh stage of manufacture.
Figure 11D:
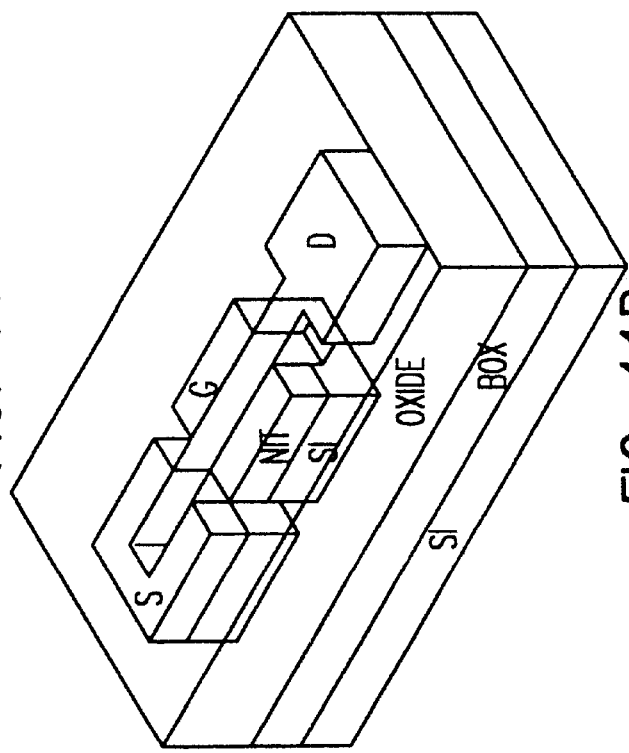
Figure 11A:
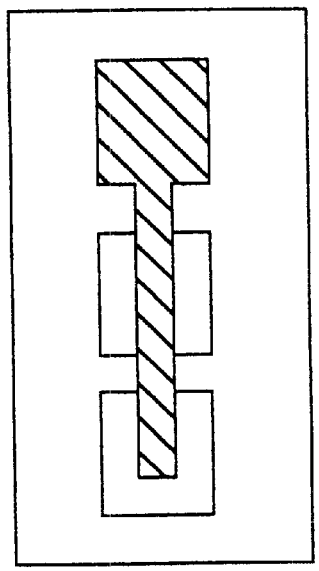
Figure 11B:
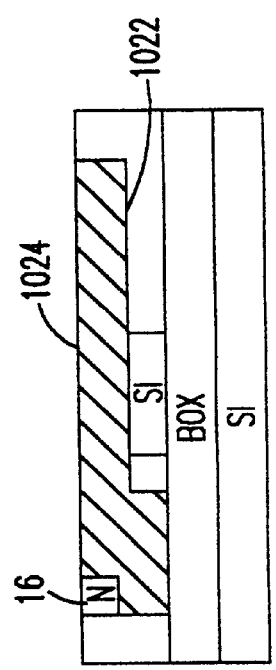

Then, as shown in FIGS. 9A–9C the oxide or phosphosilicate glass layer 50 is removed, preferably by chemical/mechanical polishing (CMP), to the remaining nitride layer 16 at the sides of the trench 66. Then, a gate oxide film 1022 is grown, preferably by thermal treatment in an oxygen atmosphere, and epitaxial silicon 1024 is grown in and over the trench 66, as shown in FIGS. 10A–10C. (The "gate oxide" which forms on the source region may be removed to allow epitaxial growth therefrom by etching in accordance with a lithographically patterned resist. Oxide growth on the source region can also be prevented by an implant such as nitrogen.) The source region thus provides the source for the epitaxial growth where the silicon is exposed and the source, channel and drain thus are a single, unitary, monocrystalline as shown in FIG. 11. A monocrystalline structure contributes to improved performance by providing uniform conductivity and band gap.

Figure 12C:
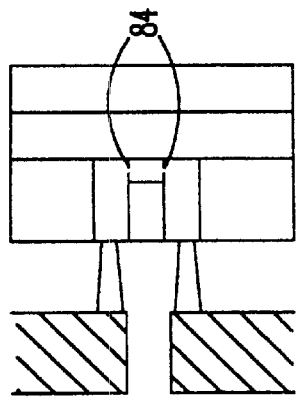
FIGS. 12A, 12B and 12C are plan, side cross-sectional and axial cross-sectional views of the transistor in accordance with the invention at a final stage of manufacture, completing the device.
Figure 12A:
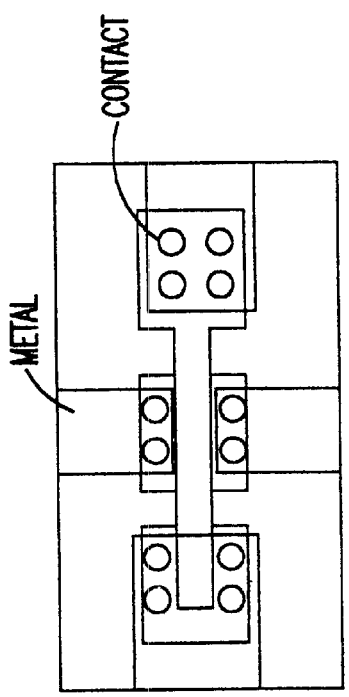
Figure 12B:
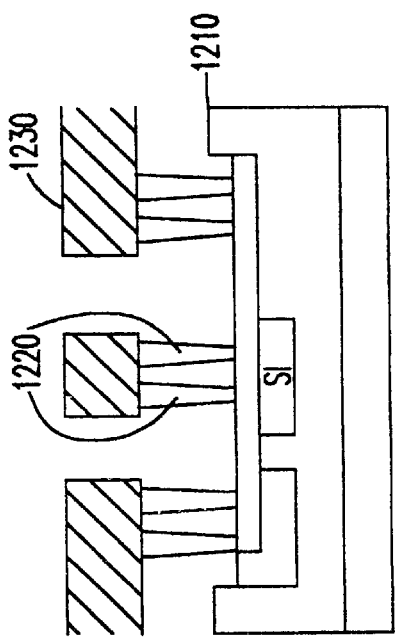

Then, as shown in FIGS. 12A–12C standard Back end of line (BEOL) processes are employed to provide a passivation layer 1210, planarize it, form contacts 1220 and metal interconnects 1230 to complete the device. Suitable processes are well-understood in the art and, in any event, are not critical to the practice of the invention.

In view of the foregoing, it is seen that the invention, as described above, provides a dual or wraparound gate structure in a FET which preserves off-current performance of the FET even when the gate structure is very short. The transistor can be manufactured reliably and with high manufacturing yield notwithstanding sub-lithographic dimensions of the conduction channel.

While the invention has been described in terms of a single preferred embodiment, those skilled in the art will recognize that the invention can be practiced with modification within the spirit and scope of the appended claims.

We claim:

1. A field effect transistor comprising:
   a semiconductor substrate;
   an insulation layer formed on said semiconductor substrate;
   a conduction channel formed on said insulation layer; and
   a gate located on at least two sides of said conduction channel and separated from a source region, wherein a portion of said gate extends between said conduction channel and said insulation layer.

2. A field effect transistor as recited in claim 1,
   wherein a unitary monocrystalline structure forms said source region, said conduction channel and a drain region of said field effect transistor.

3. A field effect transistor as recited in claim 2, wherein said unitary monocrystalline structure is epitaxially grown.

4. A field effect transistor as recited in claim 2, wherein a dimension across said conduction channel is less than 500 Angstroms.

5. A field effect transistor as recited in claim 1,
   wherein a length of said gate in the direction of the conduction channel is less than 50 nanometers.

6. A field effect transistor as recited in claim 1, wherein said gate surrounds three sides of said conduction channel.

7. An integrated circuit including a field effect transistor, said field effect transistor comprising:
   a semiconductor substrate;
   an insulation layer formed on said semiconductor substrate;
   a conduction channel formed on said insulation layer; and
   a gate located on at least two sides of said conduction channel and separated from a source region, wherein a portion of said gate extends between said conduction channel and said insulation layer.

8. An integrated circuit as recited in claim 7,
   wherein a unitary monocrystalline structure forms said source region, said conduction channel and a drain region of said field effect transistor.

9. An integrated circuit as recited in claim 8, wherein said unitary monocrystalline structure is epitaxially grown.

10. An integrated circuit as recited in claim 8, wherein a dimension across said conduction channel is less than 500 Angstroms.

11. An integrated circuit as recited in claim 7,
    wherein a width of said gate in the direction of the conduction channel is less than 100 nanometers.

12. An integrated circuit as recited in claim 7, wherein said gate surrounds three sides of said conduction channel.

13. An FET apparatus comprising:
    a dielectric material having a first depth;
    two separated substrate regions in the dielectric material having a depth less than the first depth;
    an epitaxial channel having a bottom and sides extending continuously from and in electrical contact with, a first one of the substrate regions, through the dielectric material, then through a second one of the substrate regions, but insulated from the second one of the substrate regions, then through the dielectric material and
    the second one of the substrate regions adjacent to, but insulated from, at least the bottom and sides of the epitaxial channel.

14. The apparatus of claim 13 wherein the second one of the substrate regions comprises an epitaxial substrate.

15. The apparatus of claim 13 wherein the dielectric material, the first substrate region, the second substrate region, the epitaxial channel, and the epitaxial terminal region each have a top surface forming a plurality of top surfaces and wherein said plurality of top surfaces are coplanar.

16. An FET apparatus comprising:
    a dielectric material having a first depth;
    three separated substrate regions in the dielectric material having a depth less than the first depth;
    an epitaxial channel having a bottom and sides extending continuously from, and in electrical contact with, a first one of the substrate regions, through the dielectric material, then between a second and third one of the substrate regions, but insulated from the second and third one of the substrate regions by a gate dielectric, then through the dielectric material; and
    the second and third one of the substrate regions adjacent to the sides of the epitaxial channel.

17. The apparatus of claim 16 wherein the second and third ones of the substrate regions comprise an epitaxial substrate.

18. The apparatus of claim 16 wherein the dielectric material, the first substrate region, the second and third ones of the substrate regions, the epitaxial channel, and the epitaxial terminal region each have a top surface forming a plurality of top surfaces and wherein said plurality of top surfaces are coplanar.

* * * * *